US010418451B1

(12) United States Patent
Do et al.

(10) Patent No.: US 10,418,451 B1
(45) Date of Patent: Sep. 17, 2019

(54) SPLIT-GATE FLASH MEMORY CELL WITH VARYING INSULATION GATE OXIDES, AND METHOD OF FORMING SAME

(71) Applicant: Silicon Storage Technology, Inc., San Jose, CA (US)

(72) Inventors: Nhan Do, Saratoga, CA (US); Chien-Sheng Su, Saratoga, CA (US); Jeng-Wei Yang, Zhubei (TW)

(73) Assignee: Silicon Storage Technology, Inc., San Jose, CA (US)

( * ) Notice: Subject to any disclaimer, the term of this patent is extended or adjusted under 35 U.S.C. 154(b) by 0 days.

(21) Appl. No.: 16/057,750

(22) Filed: Aug. 7, 2018

Related U.S. Application Data

(60) Provisional application No. 62/669,263, filed on May 9, 2018.

(51) Int. Cl.
*H01L 29/788* (2006.01)
*H01L 21/321* (2006.01)
(Continued)

(52) U.S. Cl.
CPC .. *H01L 29/42328* (2013.01); *H01L 21/28273* (2013.01); *H01L 21/31111* (2013.01); *H01L 21/3212* (2013.01); *H01L 21/32133* (2013.01); *H01L 23/53271* (2013.01); *H01L 27/11521* (2013.01); *H01L 29/0847* (2013.01); *H01L 29/4933* (2013.01); *H01L 29/665* (2013.01); *H01L 29/6656* (2013.01); *H01L 29/66825* (2013.01); *H01L 29/7883* (2013.01); *H01L 21/0274* (2013.01); *H01L 21/02164* (2013.01); *H01L 21/02236* (2013.01);
(Continued)

(58) Field of Classification Search
CPC ............. H01L 27/115; H01L 27/11521; H01L 29/42328; H01L 29/7885; H01L 29/4238; G11C 16/0425; G11C 16/0433
USPC ........ 257/314, 315, 316; 438/201, 211, 257, 438/262.264, 260
See application file for complete search history.

(56) References Cited

U.S. PATENT DOCUMENTS 5,029,130 A   7/1991 Yeh
5,856,943 A * 1/1999 Jeng ................... G11C 16/0425
                                              365/185
(Continued)

FOREIGN PATENT DOCUMENTS

WO       2017 184315      10/2017

*Primary Examiner* — Thinh T Nguyen
(74) *Attorney, Agent, or Firm* — DLA Piper LLP (US)

(57) ABSTRACT

A memory device includes a semiconductor substrate having spaced apart source and drain regions, with a channel region of the substrate extending there between, a floating gate of polysilicon disposed over and insulated from a first portion of the channel region by insulation material having a first thickness, wherein the floating gate has a sloping upper surface that terminates in a sharp edge, a word line gate of polysilicon disposed over and insulated from a second portion of the channel region by insulation material having a second thickness, and an erase gate of polysilicon disposed over and insulated from the source region by insulation material having a third thickness, wherein the erase gate includes a notch that wraps around and is insulated from the sharp edge of the floating gate. The third thickness is greater than the first thickness, and the first thickness is greater than the second thickness.

5 Claims, 13 Drawing Sheets

(51) Int. Cl.

| | |
|---|---|
| *H01L 29/423* | (2006.01) |
| *H01L 23/532* | (2006.01) |
| *H01L 29/08* | (2006.01) |
| *H01L 27/11521* | (2017.01) |
| *H01L 21/28* | (2006.01) |
| *H01L 29/66* | (2006.01) |
| *H01L 21/311* | (2006.01) |
| *H01L 21/3213* | (2006.01) |
| *H01L 29/49* | (2006.01) |
| H01L 21/324 | (2006.01) |
| H01L 21/02 | (2006.01) |
| H01L 21/027 | (2006.01) |
| H01L 21/3215 | (2006.01) |
| H01L 21/265 | (2006.01) |

(52) U.S. Cl.
CPC ...... *H01L 21/26513* (2013.01); *H01L 21/324* (2013.01); *H01L 21/32155* (2013.01)

(56) References Cited

U.S. PATENT DOCUMENTS

| | | |
|---|---|---|
| 6,747,310 B2 | 6/2004 | Fan et al. |
| 6,855,980 B2 | 2/2005 | Wang et al. |
| 6,952,034 B2 | 10/2005 | Hu et al. |
| 7,315,056 B2 | 1/2008 | Klinger |
| 7,868,375 B2 | 1/2011 | Liu et al. |
| 7,927,994 B1 | 4/2011 | Liu et al. |
| 2013/0313626 A1 | 11/2013 | Huang et al. |
| 2014/0091382 A1 | 4/2014 | Tadayoni et al. |
| 2015/0213898 A1 | 7/2015 | Do et al. |
| 2017/0040334 A1 | 2/2017 | Cheng et al. |

\* cited by examiner

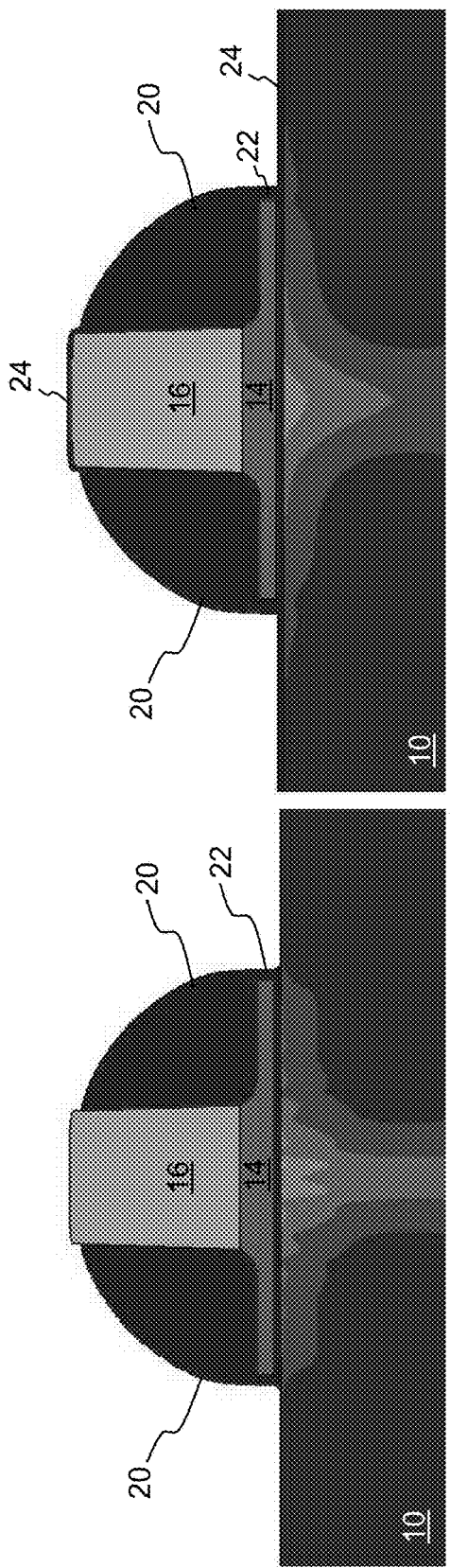

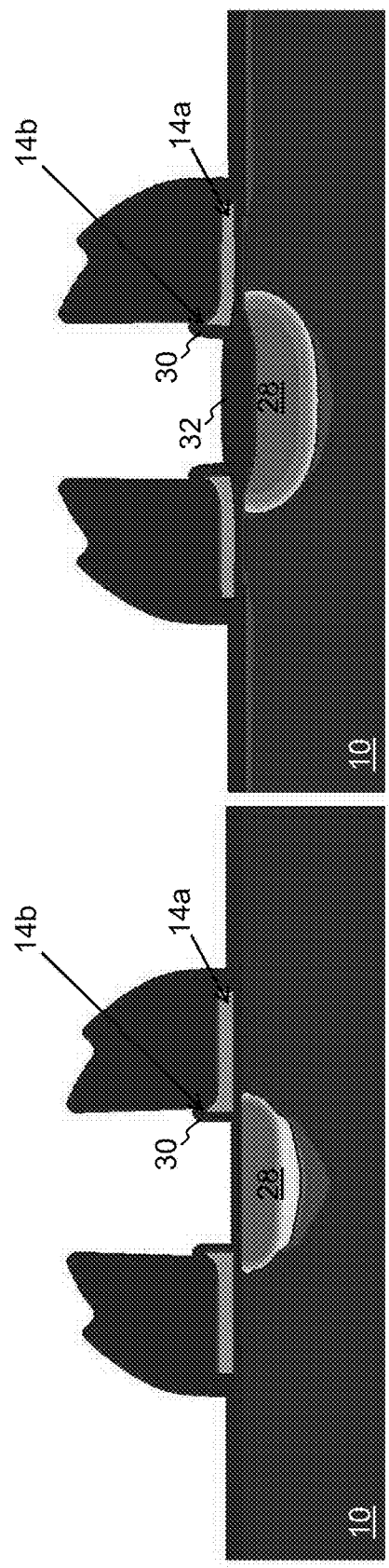

SPLIT-GATE FLASH MEMORY CELL WITH VARYING INSULATION GATE OXIDES, AND METHOD OF FORMING SAME

RELATED APPLICATIONS

This application claims the benefit of U.S. Provisional Application No. 62/669,263 filed on May 9, 2018, and which is incorporated herein by reference.

FIELD OF THE INVENTION

The present invention relates to split gate non-volatile memory cells

BACKGROUND OF THE INVENTION

Split gate non-volatile memory cells with three gates are known. See for example U.S. Pat. No. 7,315,056, which discloses split gate memory cells each having source and drain regions in a semiconductor substrate with a channel region extending there between, a floating gate over a first portion of the channel region, a control gate (also called a word line gate) over a second portion of the channel region, and a P/E gate over the source region.

Fabrication method improvements are needed to better control the formation of various elements of the memory cells.

BRIEF SUMMARY OF THE INVENTION

The aforementioned problems and needs are addressed by a memory device that includes a semiconductor substrate having spaced apart source and drain regions, with a channel region of the substrate extending between the source and drain regions, a floating gate of polysilicon disposed over and insulated from a first portion of the channel region by insulation material having a first thickness, wherein the floating gate has a sloping upper surface that terminates in a sharp edge, a word line gate of polysilicon disposed over and insulated from a second portion of the channel region by insulation material having a second thickness, and an erase gate of polysilicon disposed over and insulated from the source region by insulation material having a third thickness, wherein the erase gate includes a notch that wraps around and is insulated from the sharp edge of the floating gate. The third thickness is greater than the first thickness, and the first thickness is greater than the second thickness.

A memory device includes a semiconductor substrate having a source region, a first drain region and a second drain region, with a first channel region of the substrate extending between the source region and the first drain region, and a second channel region of the substrate extending between the source region and the second drain region. A first floating gate of polysilicon is disposed over and insulated from a first portion of the first channel region by insulation material having a first thickness, wherein the first floating gate has a sloping upper surface that terminates in a first sharp edge. A second floating gate of polysilicon is disposed over and insulated from a first portion of the second channel region by insulation material having the first thickness, wherein the second floating gate has a sloping upper surface that terminates in a second sharp edge. A first word line gate of polysilicon is disposed over and insulated from a second portion of the first channel region by insulation material having a second thickness. A second word line gate of polysilicon is disposed over and insulated from a second portion of the second channel region by insulation material having the second thickness. An erase gate of polysilicon is disposed over and insulated from the source region by insulation material having a third thickness, wherein the erase gate includes a first notch that wraps around and is insulated from the first sharp edge of the first floating gate and a second notch that wraps around and is insulated from the second sharp edge of the second floating gate. The third thickness is greater than the first thickness, and the first thickness is greater than the second thickness.

A method of forming a memory device includes:
forming a first insulation layer having a first thickness on a semiconductor substrate;
forming a first polysilicon layer on the first insulation layer;
forming a first and second spaced apart insulation spacers on the first polysilicon layer;
removing portions of the first polysilicon layer such that a first block of the first polysilicon layer remains under the first insulation spacer and a second block of the first polysilicon layer remains under the second insulation spacer, wherein each of the first and second blocks of the first polysilicon layer has a sloping upper surface that terminates in a sharp edge;
forming a source region in the substrate that is disposed under a gap between the first and second blocks of the first polysilicon layer;
forming a second insulation layer having a second thickness on the semiconductor substrate over the source region;
forming a third insulation layer having a third thickness on the semiconductor substrate adjacent side surfaces of the first and second blocks of the first polysilicon layer that face away from each other;
forming a second polysilicon layer over the substrate and the first and second insulation spacers;
removing portions of the second polysilicon layer such that a first block of the second polysilicon layer remains that is disposed on the second insulation layer and between the first and second insulation spacers, and second and third blocks of the second polysilicon layer remain that are disposed on the third insulation layer, wherein the first insulation spacer is disposed between the first and second blocks of the second polysilicon layer and wherein the second insulation spacer is disposed between the first and third blocks of the second polysilicon layer;
forming a first drain region in the substrate adjacent the second block of the second polysilicon layer; and
forming a second drain region in the substrate adjacent the third block of the second polysilicon layer;
wherein the first block of the second polysilicon layer includes a first notch that wraps around and is insulated from the sharp edge of the first block of the first polysilicon layer and a second notch that wraps around and is insulated from the sharp edge of the second block of the first polysilicon layer;
wherein the second thickness is greater than the first thickness, and wherein the first thickness is greater than the third thickness.

Other objects and features of the present invention will become apparent by a review of the specification, claims and appended figures.

BRIEF DESCRIPTION OF THE DRAWINGS

FIGS. 1-17 are side cross sectional views showing the steps in forming the memory cells.

DETAILED DESCRIPTION OF THE INVENTION

Figure 1:
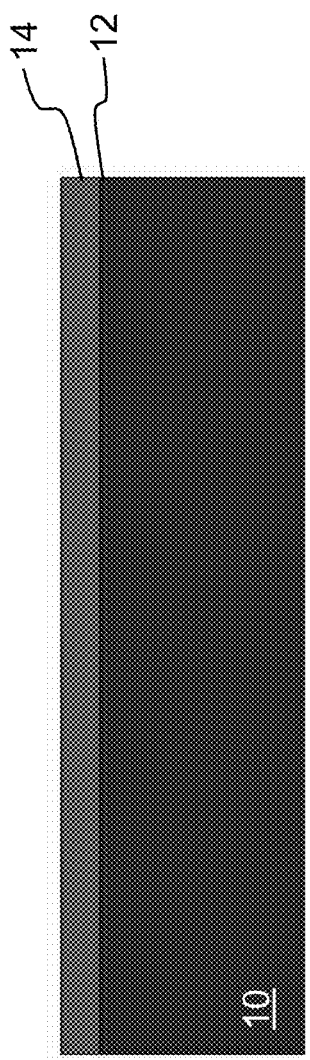
Figure 2:
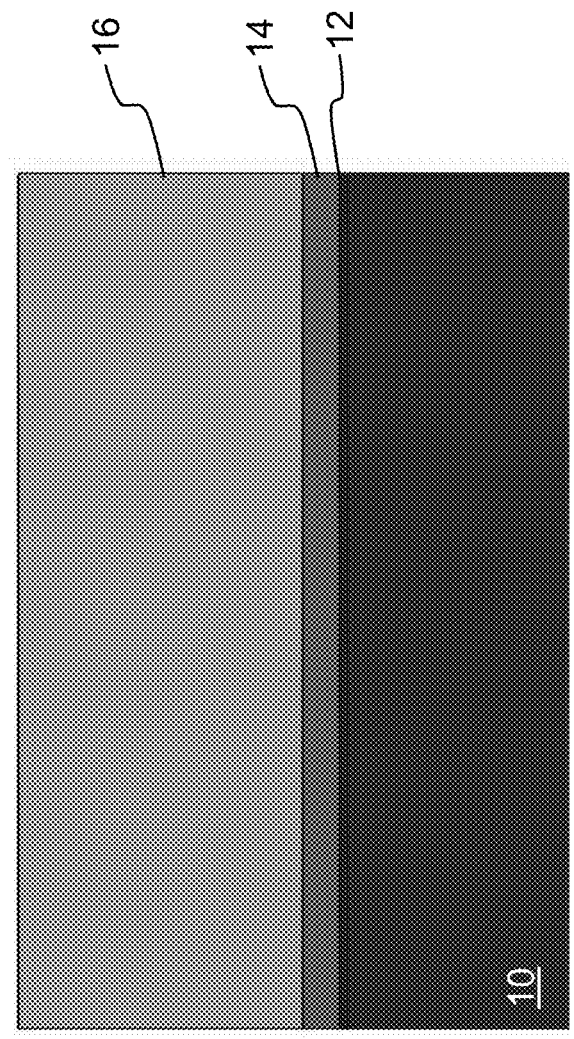
Figure 3:
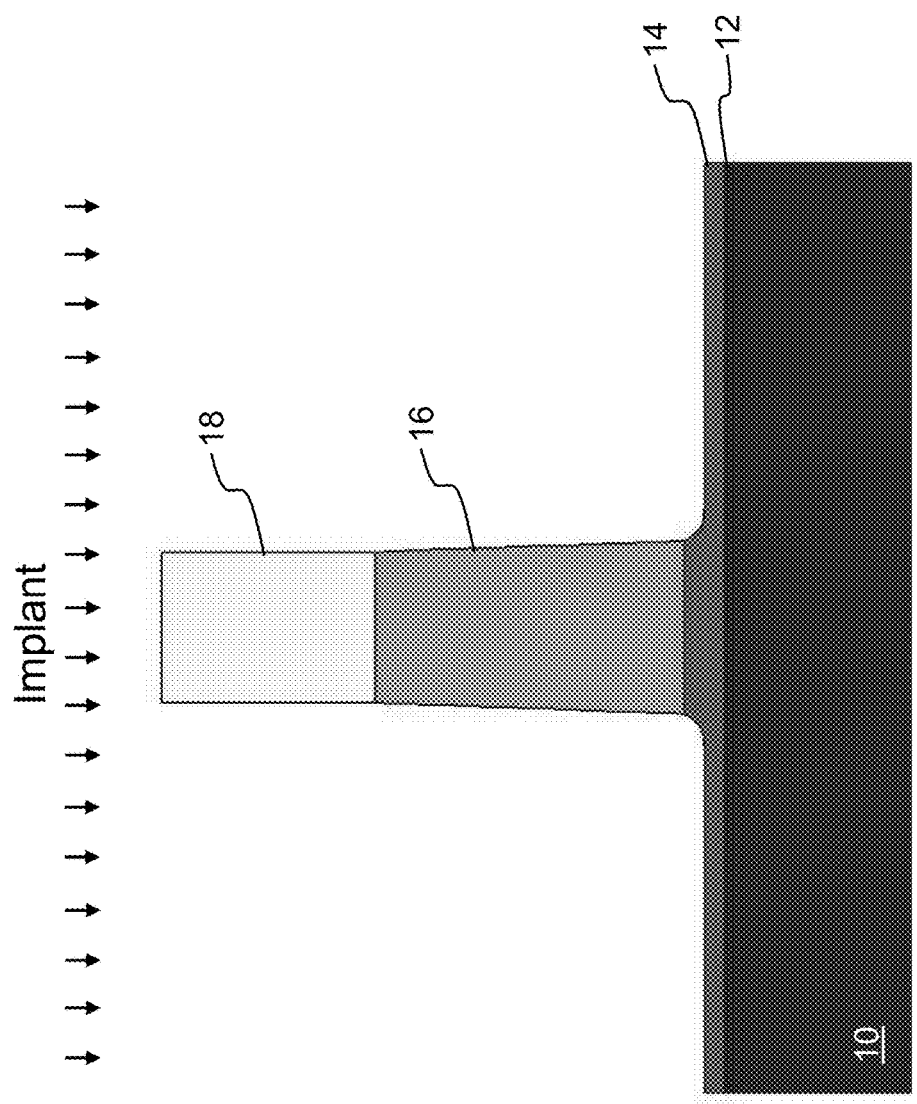

The present invention is an improved method of forming non-volatile split gate memory cells having three gates per memory cell. While the figures show only a pair of memory cells being formed, it should be appreciated that an array of memory cells are formed during the process. The process begins by forming an silicon dioxide layer (oxide) 12 on the upper surface of a semiconductor substrate 10, and a polysilicon layer (poly) 14 on the oxide layer 12, as shown in FIG. 1. To dope the poly, a poly implant can be performed at this time. A silicon nitride layer (nitride) 16 is formed as a hard mask on the poly layer 12, as shown in FIG. 2. Photo resist 18 is formed over the structure and patterned using a photolithography process (i.e., photo resist formation, selective exposure of the photo resist, removal of selective portions of the photoresist leaving portions of the underlying material exposed). Here, portions of the nitride layer 16 are left exposed. A nitride etch is then used to remove the exposed portions of the nitride layer 16 not protected by the patterned photoresist 18, leaving a block of the nitride 16 on the poly layer 14. A polysilicon sloped etch is then used to etch the upper surface of poly layer 14, creating a sloped upper surface for the poly layer where the upper surface slopes upwardly as it approaches the block of nitride 16. To control the floating gate threshold voltage, an implantation is then performed on the exposed portions of the poly layer 14, as shown in FIG. 3.

Figure 4:
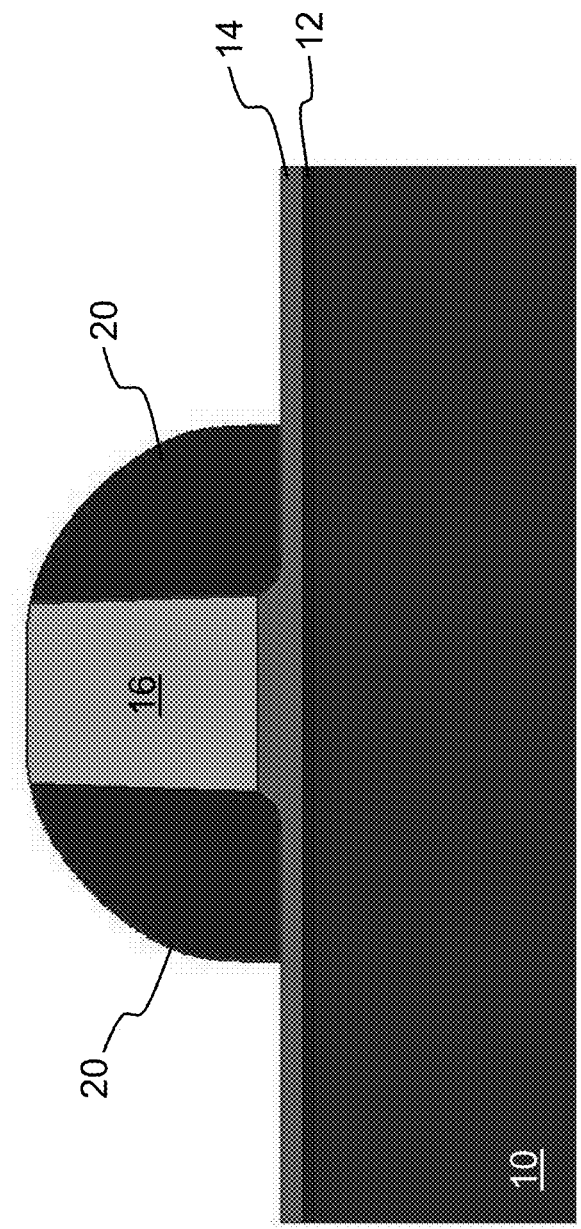
Figure 5:
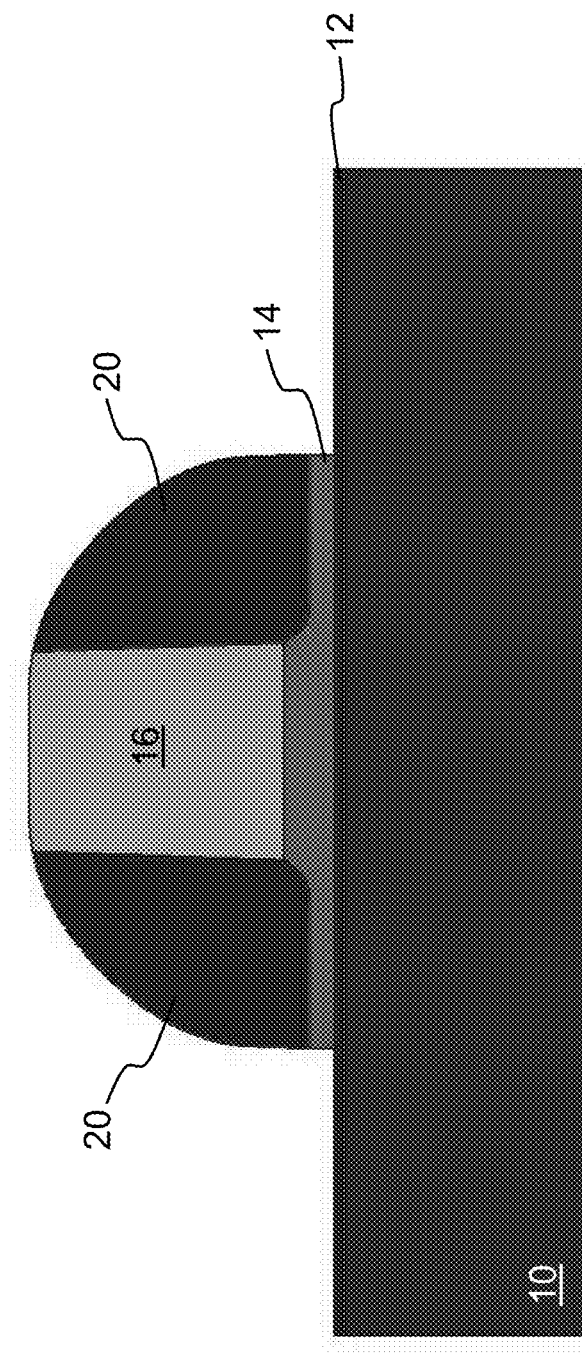

After photo resist removal, oxide spacers 20 are formed on the poly layer 14. Formation of spacers is well known, and involves the deposition of material followed by an anisotropic etch of the material, whereby the material is removed except for portions thereof abutting vertically oriented structures. The upper surface of the spacer is typically rounded. In this case, oxide is deposited, followed by an anisotropic oxide etch leaving oxide spacers 20 abutting the side walls of nitride block 16, as shown in FIG. 4. A poly etch is performed to remove the portions of the poly layer 14 not protected by the oxide spacers 20, as shown in FIG. 5. To control the word line threshold voltage, an implant into the portions of the substrate also not protected by the nitride block 16 and oxide spacers 20 can be performed at this time (using oxide layer 12 on the substrate surface as a buffer layer). An oxide spacer 22 is formed on the exposed ends of the poly layer 14 to form the main isolation between poly 14 and the word line gate to be formed later by performing oxide deposition (e.g., high temperature oxide HTO deposition), and an anisotropic oxide etch, which leaves oxide spacer 22 on the ends (along the side surfaces) of the poly layer 14, as shown in FIG. 6. Another oxide layer 24 is then deposited on the structure (as the main portion of the gate oxide for high-voltage peripheral devices to be formed later), for example by high temperature oxide deposition, as shown in FIG. 7.

Figure 8:
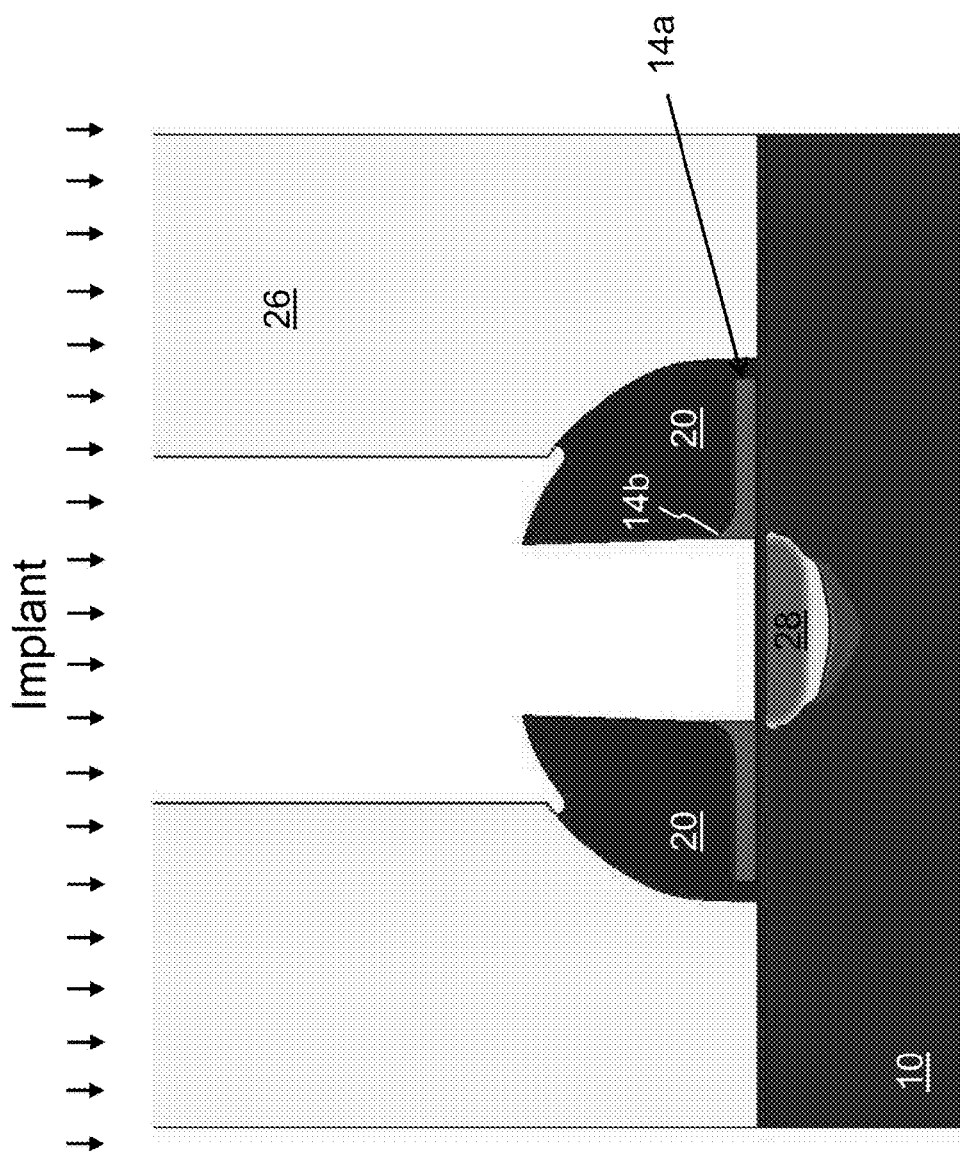

The structure is covered with photoresist 26, which is patterned to remove the portion of the photoresist over the nitride block 16. Oxide, nitride and poly etches are performed to remove oxide layer 24 on the nitride block 16, the nitride block 16, and the portion of the poly layer 14 exposed by the removal of the nitride block 16, leaving poly blocks 14a having an upwardly sloping upper surface that terminates in a sharp edge 14b. An implant process follows for forming the source region 28 in the substrate 10 between the oxide spacers 20 and poly blocks 14a (i.e., the source region is formed under a gap that exists between the oxide spacers 20 and a gap that exists between the poly blocks 14a). The resulting structure is shown in FIG. 8.

A tunnel oxide layer 30 is then formed on the exposed ends of the poly blocks 14a including the sharp edges 14b, as shown in FIG. 9. Specifically, the tunnel oxide layer 30 is formed by first performing an oxide etch (e.g., wet etch) to laterally recess the sidewall of each spacer 20 away from the respective ends of the poly blocks 14a, exposing the sharp edges 14b. The tunnel oxide layer 30 is then formed by high temperature oxide HTO deposition. The tunnel oxide layer 30 extends along the exposed sidewalls of poly layer blocks 14a, and wraps around the sharp edges 14b. However, the HTO deposition does not consume the polysilicon sharp edges 14b, thus maintaining their shape.

Figures 11, 12:
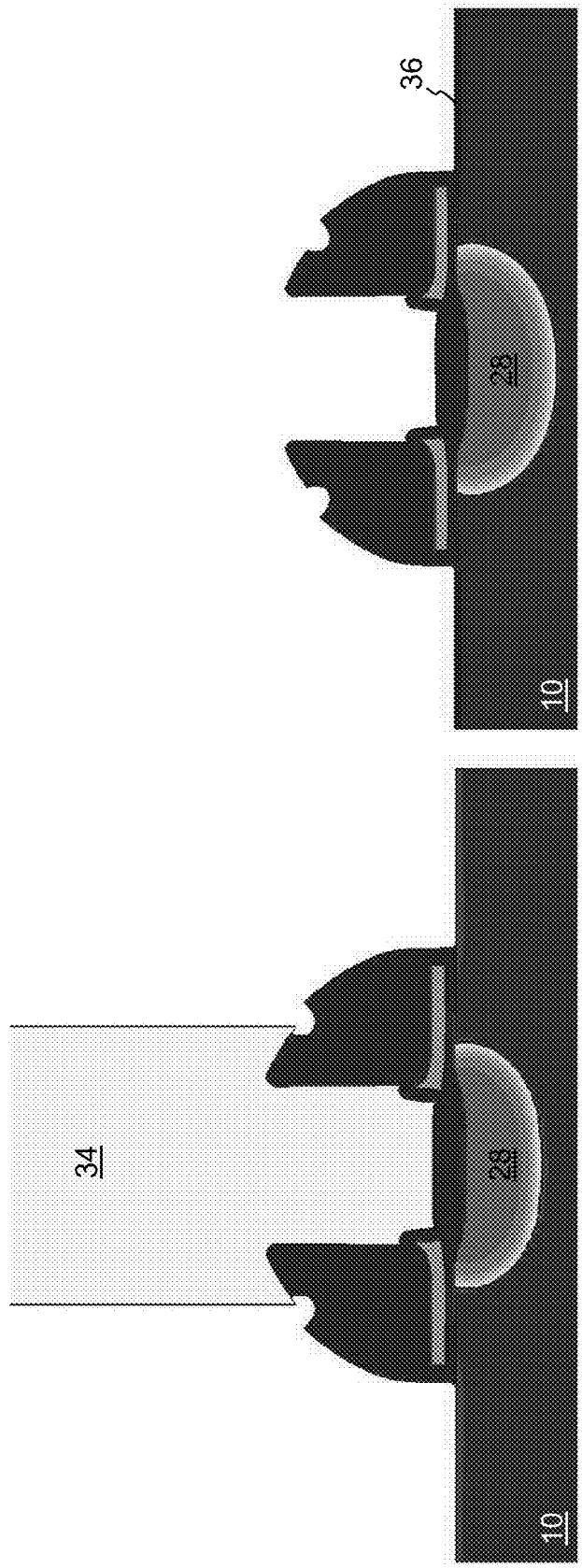

A wet oxidation is then used to thicken the oxide 32 over the source region 28 and the tunnel oxide layer 30 wrapping around the sharp edges 14b, as shown in FIG. 10. Photoresist 34 is then formed between the oxide spacers 20, and an oxide etch is used to remove the oxide layer on the substrate outside of the pair of spacers, leaving the substrate surface exposed, as shown in FIG. 11. Then, a thin oxide layer (WL oxide) 36 is formed on the substrate outside of the pair of spacers, as shown in FIG. 12 (after photo resist removal).

Figure 13:
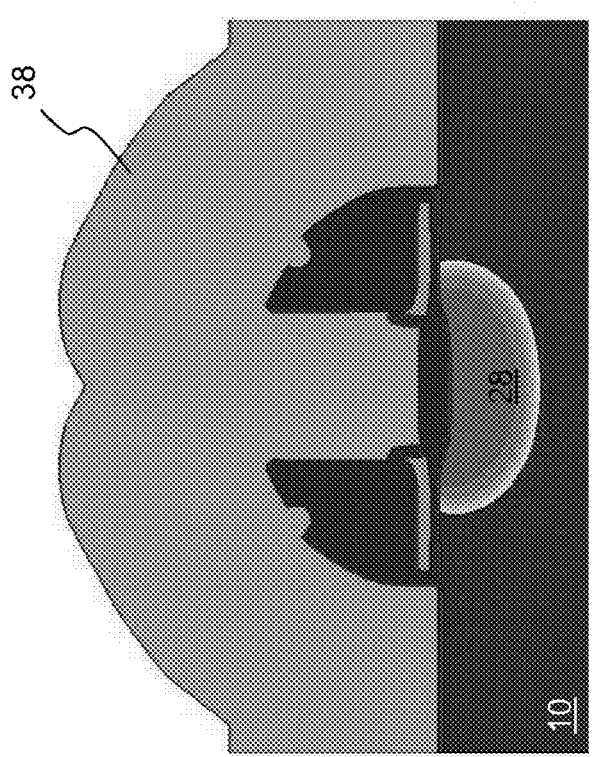

A layer of polysilicon 38 is then formed over the structure. This poly layer can be used in the logic areas of the same substrate. If it desirous for the poly layer thickness to be thicker in the memory array than the logic area, a cap oxide layer can be formed on the poly layer 38 and patterned to remove the cap oxide layer from the memory area of the device, followed by the deposition of additional polysilicon to thicken the poly layer 38 in the memory area. The additional polysilicon on the cap oxide layer in the logic area will later be removed by a poly CMP described below. The resulting structure is shown in FIG. 13.

Figure 14:
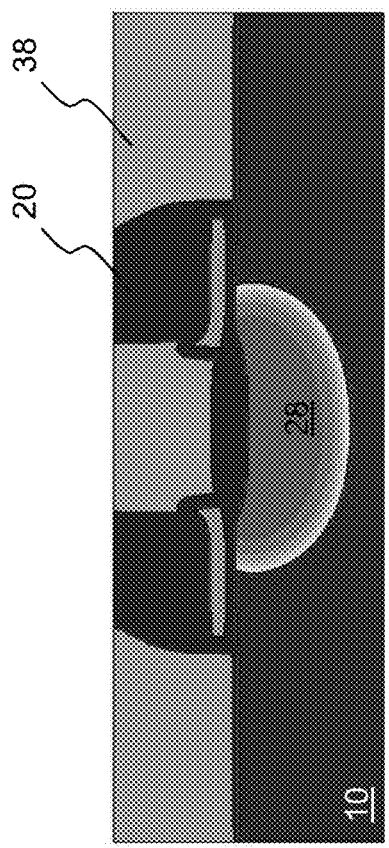
Figure 15:
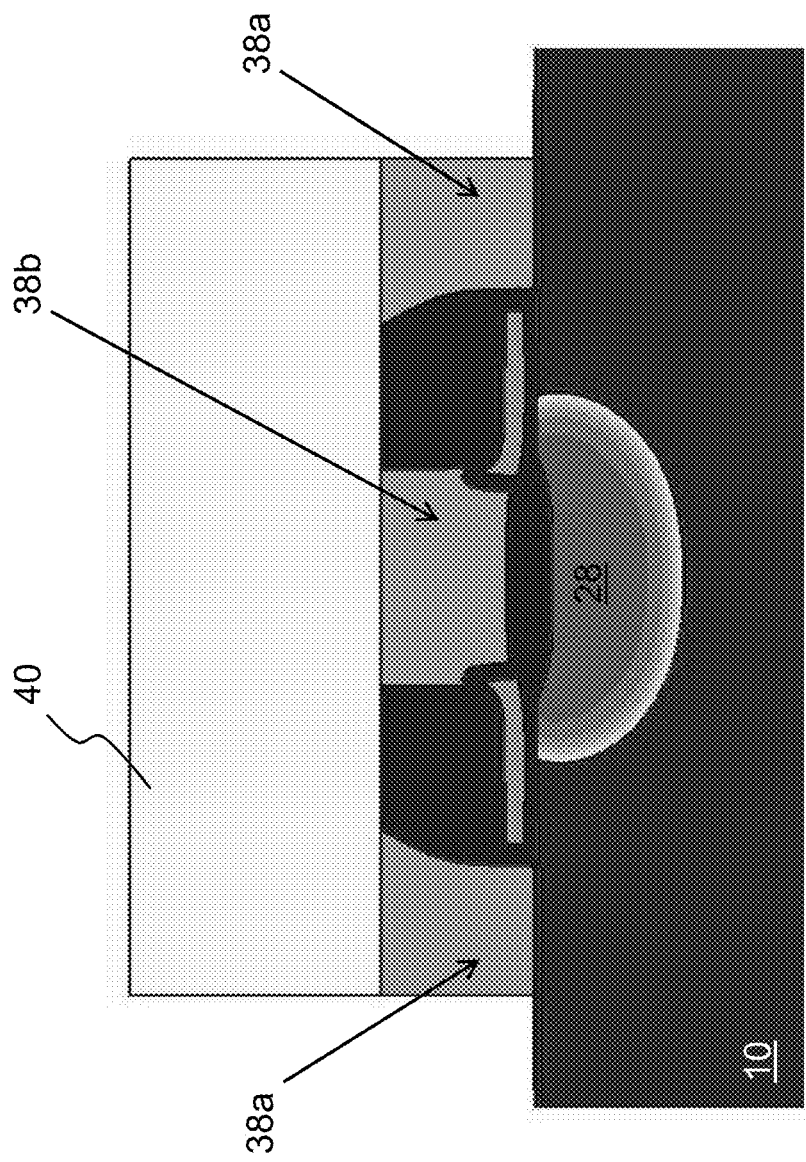

The structure is then planarized by a poly CMP (chemical mechanical polish) to below the tops of the oxide spacers 20. The poly layer 38 can be doped by implantation with material and annealed at this time. The resulting structure is shown in FIG. 14. Photoresist 40 is formed on the structure and patterned leaving only those portions of the poly layer 38 between the oxide spacers 20 and immediately outside of the oxide spacers 20 covered by the photo resist 40. A poly etch is then used to remove the exposed portions of the poly layer 38 not protected by the photo resist 40, leaving blocks 38a of the poly layer 38 adjacent to the outsides of the oxide spacers 20, and a block 38b of the poly layer 38 between the oxide spacers 20. The resulting structure is shown in FIG. 15.

Figure 16:
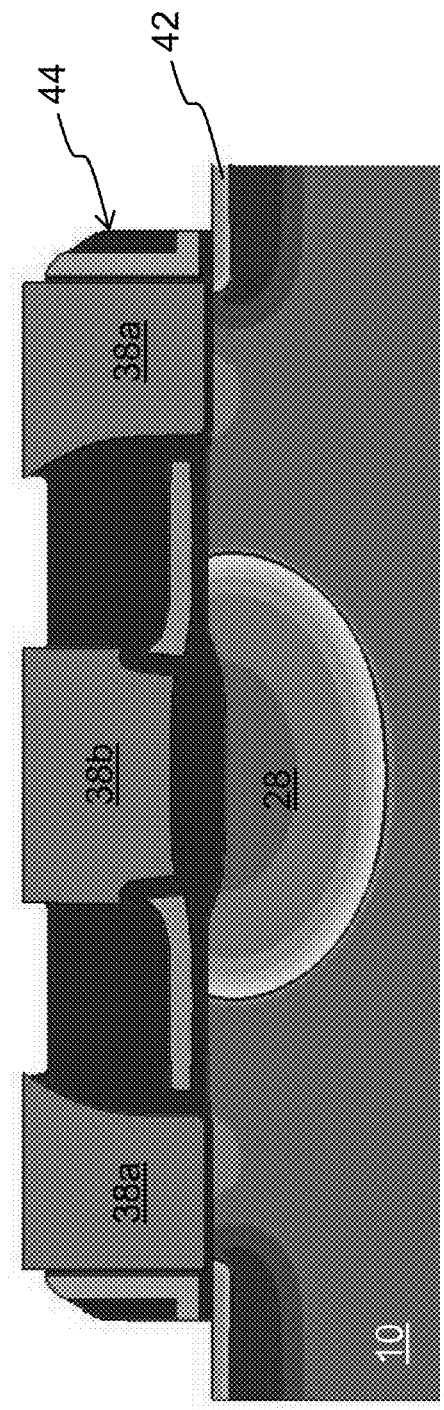

An implantation is then performed to form drain regions 42 in the substrate adjacent the poly blocks 38a. Spacers 44 of insulation material are then formed on the outsides of poly blocks 38a. Preferably, these spacers are formed by forming one or more insulation layers (e.g., oxide, nitride, oxide) followed by one or more anisotropic etches, as shown in FIG. 16. An additional implant and anneal can then be used to further enhance the drain regions 42. Salicide 46 is then formed on the exposed upper surfaces of the poly blocks 38a and 38b, for improved conductivity. ILD insulation is then formed over the structure, which preferably includes insulation material 48a formed over insulation layers 48b. Contact holes are then formed through the ILD insulation, exposing the drain regions 42. Conductive material is then formed on the structure and patterned, filling the contact holes, to form a bit line 50 extending over the ILD insulation 48, and contacts 52 extending between and providing electrical conduction between the bit line 50 and the drain regions 42. The final structure is shown in FIG. 17.

Figure 17:
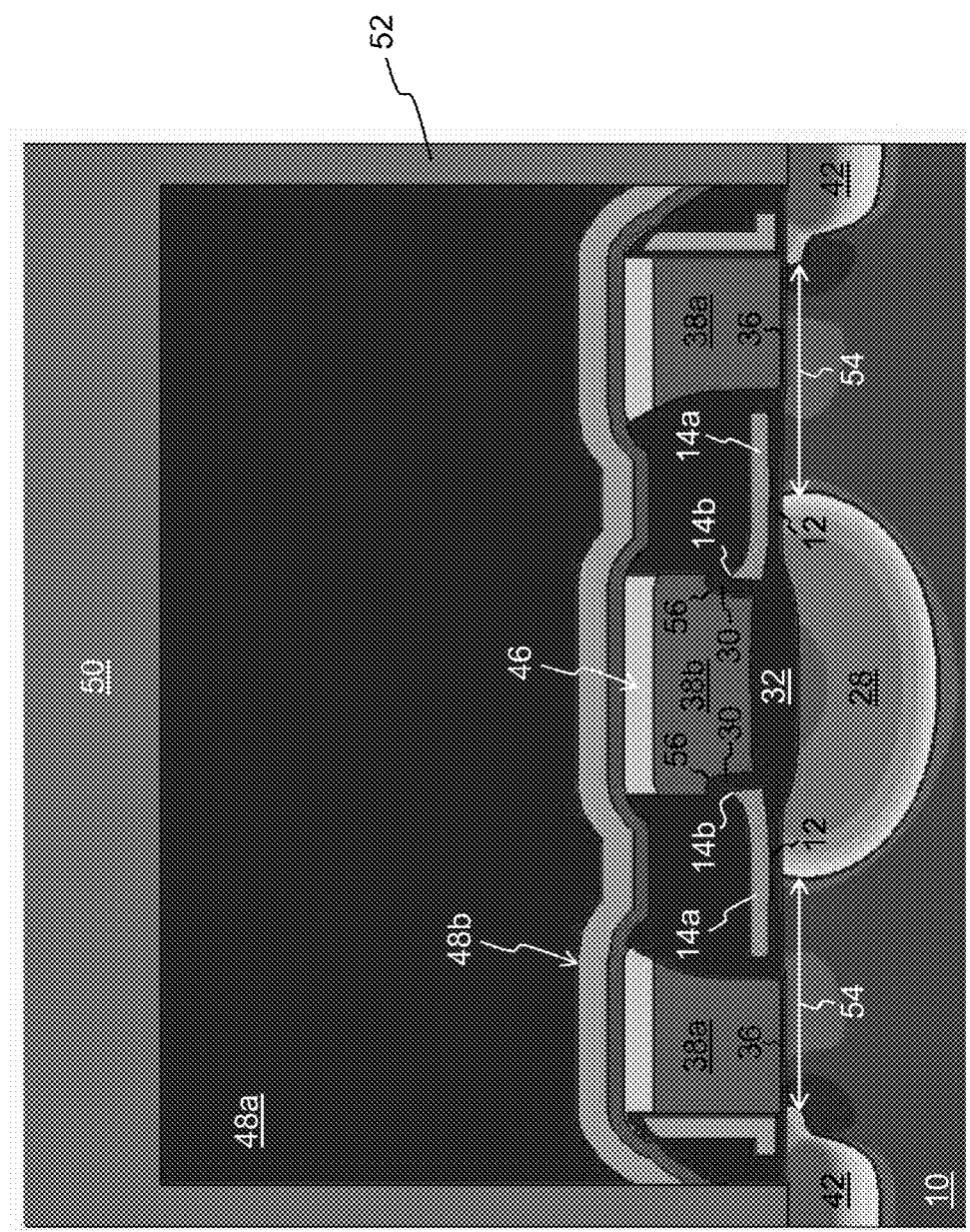

As shown in FIG. 17, the process forms pairs of memory cells. Each memory cell pair includes a source region 28 and two drain regions 42, with two channel regions 54 each extending between the source region 28 and one of the drain regions 42. An erase gate 38b is disposed over and insulated from the source region 28 by the thick oxide layer 32. Each memory cell includes a floating gate 14a disposed over and insulated from a first portion of the channel region 54, and a word line gate 38a disposed over and insulated from a second portion of the channel region 54. The floating gate 14a has a sharp tip 14b (caused by the sloping surface) that faces a notch 56 formed in the erase gate 38b, whereby the erase gate 38b wraps around the sharp tip 14b of the floating gate 14a. The sharp tip 14b is insulated from the erase gate 38b by the tunnel oxide layer 30. The word line gates 38a are insulated from the substrate by an oxide layer 36 that is thinner than the oxide 12 between the floating gate 14a and the substrate 10, which is thinner than the oxide 32 between the erase gate 38b and the source region 28. The oxide layer 36 under the word line gate 38a and the tunnel oxide 30 are formed separately, and therefore can be separately adjusted in terms of thickness for optimal performance.

The cell size can be scaled down by shortening the portion of the channel region 54 under the word line gate 38a (i.e., making the length of word line gate 38a in the direction of the channel region shorter), and thinning the oxide layer 36 under the word line gate 38a (which can be done independently relative to other insulation layers such as the tunnel oxide that can remain thicker) which allows for a higher current drive for the memory cell. The erase gate 38b and word line gates 38a are formed by the same poly deposition, so only two poly depositions are needed to form the floating gates 14a, the word line gates 38a and the erase gates 38b for all the memory cells. The length of each word line gate 38a (in the direction of the channel region) is determined by photolithography for better dimension control. The height of the word line gates 38a and erase gate 38b are determine by chemical mechanical polish, which avoids defect issues that could exist should the word line gates instead be made by a poly spacer technique. The isolation (oxide) between the floating gate 14a and word line gate 38a can be independently optimized, because that oxide is originally formed as oxide 22 which is then thickened by subsequent processing. Finally, the tunnel oxide 30 is formed as a single layer wrapping around the sharp tip of the floating gate, and thickened by a subsequent wet oxidation process. Using the above method, erase efficiency and word line gate performance can be independently optimized.

It is to be understood that the present invention is not limited to the embodiment(s) described above and illustrated herein, but encompasses any and all variations falling within the scope of any claims. For example, references to the present invention herein are not intended to limit the scope of any claim or claim term, but instead merely make reference to one or more features that may be covered by one or more of the claims. Materials, processes and numerical examples described above are exemplary only, and should not be deemed to limit the claims. Further, not all method steps need be performed in the exact order illustrated or claimed, but rather in any order that allows the proper formation of the non-volatile memory cells of the present invention. Single layers of material could be formed as multiple layers of such or similar materials, and vice versa. Lastly, the terms "forming" and "formed" as used herein shall include material deposition, material growth, or any other technique in providing the material as disclosed or claimed.

It should be noted that, as used herein, the terms "over" and "on" both inclusively include "directly on" (no intermediate materials, elements or space disposed there between) and "indirectly on" (intermediate materials, elements or space disposed there between). Likewise, the term "adjacent" includes "directly adjacent" (no intermediate materials, elements or space disposed there between) and "indirectly adjacent" (intermediate materials, elements or space disposed there between), "mounted to" includes "directly mounted to" (no intermediate materials, elements or space disposed there between) and "indirectly mounted to" (intermediate materials, elements or spaced disposed there between), and "electrically coupled" includes "directly electrically coupled to" (no intermediate materials or elements there between that electrically connect the elements together) and "indirectly electrically coupled to" (intermediate materials or elements there between that electrically connect the elements together). For example, forming an element "over a substrate" can include forming the element directly on the substrate with no intermediate materials/elements there between, as well as forming the element indirectly on the substrate with one or more intermediate materials/elements there between.

What is claimed is:

1. A memory device, comprising:
   a semiconductor substrate having a source region, a first drain region and a second drain region, with a first channel region of the substrate extending between the source region and the first drain region, and a second channel region of the substrate extending between the source region and the second drain region;
   a first floating gate of polysilicon disposed over and insulated from a first portion of the first channel region by insulation material having a first thickness, wherein the first floating gate has a sloping upper surface that terminates in a first sharp edge;
   a second floating gate of polysilicon disposed over and insulated from a first portion of the second channel region by insulation material having the first thickness, wherein the second floating gate has a sloping upper surface that terminates in a second sharp edge;
   a first word line gate of polysilicon disposed over and insulated from a second portion of the first channel region by insulation material having a second thickness;
   a second word line gate of polysilicon disposed over and insulated from a second portion of the second channel region by insulation material having the second thickness; and
   an erase gate of polysilicon disposed over and insulated from the source region by insulation material having a third thickness, wherein the erase gate includes a first notch that wraps around and is insulated from the first sharp edge of the first floating gate and a second notch that wraps around and is insulated from the second sharp edge of the second floating gate;
   wherein the third thickness is greater than the first thickness, and wherein the first thickness is greater than the second thickness.

2. The memory device of claim 1, wherein:
   the insulation material having the first thickness is oxide;
   the insulation material having the second thickness is oxide; and
   the insulation material having the third thickness is oxide.

3. The memory device of claim 1, further comprising:
a first spacer of insulation material disposed directly on the first floating gate and extending directly between the first word line gate and the erase gate;
a second spacer of insulation material disposed directly on the second floating gate and extending directly between the second word line gate and the erase gate.

4. The memory device of claim 1, further comprising:
salicide formed on upper surfaces of the first and second word line gates and the erase gate.

5. The memory device of claim 1, wherein:
the first and second notches of the erase gate are insulated from the first and second sharp edges of the first and second floating gates, respectively, by insulation material having a fourth thickness; and
the second thickness is less than the fourth thickness.

* * * * *